United States Patent
Barkon et al.

(10) Patent No.: US 8,830,746 B2
(45) Date of Patent: Sep. 9, 2014

(54) OPTIMIZED THRESHOLD SEARCH IN ANALOG MEMORY CELLS USING SEPARATOR PAGES OF THE SAME TYPE AS READ PAGES

(71) Applicant: Apple Inc., Cupertino, CA (US)

(72) Inventors: Maya Barkon, Haifa (IL); Meir Dalal, Rishon Lezion (IL); Moti Teitel, Shoham (IL); Micha Anholt, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/905,580

(22) Filed: May 30, 2013

(65) Prior Publication Data

US 2013/0258738 A1    Oct. 3, 2013

Related U.S. Application Data

(63) Continuation-in-part of application No. 13/595,571, filed on Aug. 27, 2012.

(60) Provisional application No. 61/580,673, filed on Dec. 28, 2011.

(51) Int. Cl.
  *G11C 11/34* (2006.01)
  *G11C 16/34* (2006.01)
  *G11C 27/00* (2006.01)
  *G11C 29/02* (2006.01)
  *G11C 11/56* (2006.01)

(52) U.S. Cl.
  CPC ............ *G11C 27/00* (2013.01); *G11C 16/3418* (2013.01); *G11C 29/021* (2013.01); *G11C 29/028* (2013.01); *G11C 11/5642* (2013.01)
  USPC ................................ 365/185.03; 365/189.15

(58) Field of Classification Search
  USPC ........................................ 365/185.03, 189.15
  See application file for complete search history.

(56) References Cited

U.S. PATENT DOCUMENTS

| | | | |
|---|---|---|---|
| 8,000,135 B1 | 8/2011 | Perlmutter et al. | |
| 2007/0297245 A1* | 12/2007 | Mokhlesi | 365/185.28 |
| 2009/0059698 A1* | 3/2009 | Chang et al. | 365/201 |
| 2009/0199074 A1 | 8/2009 | Sommer | |
| 2011/0161775 A1 | 6/2011 | Weingarten | |
| 2012/0221917 A1 | 8/2012 | Bueb et al. | |

FOREIGN PATENT DOCUMENTS

| | | |
|---|---|---|
| JP | 2011100519 | 5/2011 |
| JP | 2011165301 | 8/2011 |

OTHER PUBLICATIONS

Notice of Preliminary Rejection from Korean Patent Application No. 10- 2012-154383, mailed Feb. 12, 2014, English and Korean versions, pp. 1-8.

Office Action from Japanese Patent Application No. 2012-289484, mailed Dec. 26, 2014, English and Japanese versions, pp. 1-5.

* cited by examiner

*Primary Examiner* — Anthan Tran
(74) *Attorney, Agent, or Firm* — Meyertons, Hood, Kivlin, Kowert & Goetzel, P.C.

(57) ABSTRACT

A method includes reading a group of analog memory cells using first explicit read thresholds, to produce first readout results. The group is re-read using second explicit read thresholds, to produce second readout results. The group is read using one or more sets of auxiliary thresholds so as to produce auxiliary readout results, such that the number of the auxiliary thresholds in each set is the same as the number of the first explicit read thresholds and the same as the number of the second explicit read thresholds. A readout performance of third read thresholds, which include at least one of the first explicit read thresholds and at least one of the second explicit read thresholds, is evaluated using the first, second and auxiliary readout results.

20 Claims, 5 Drawing Sheets

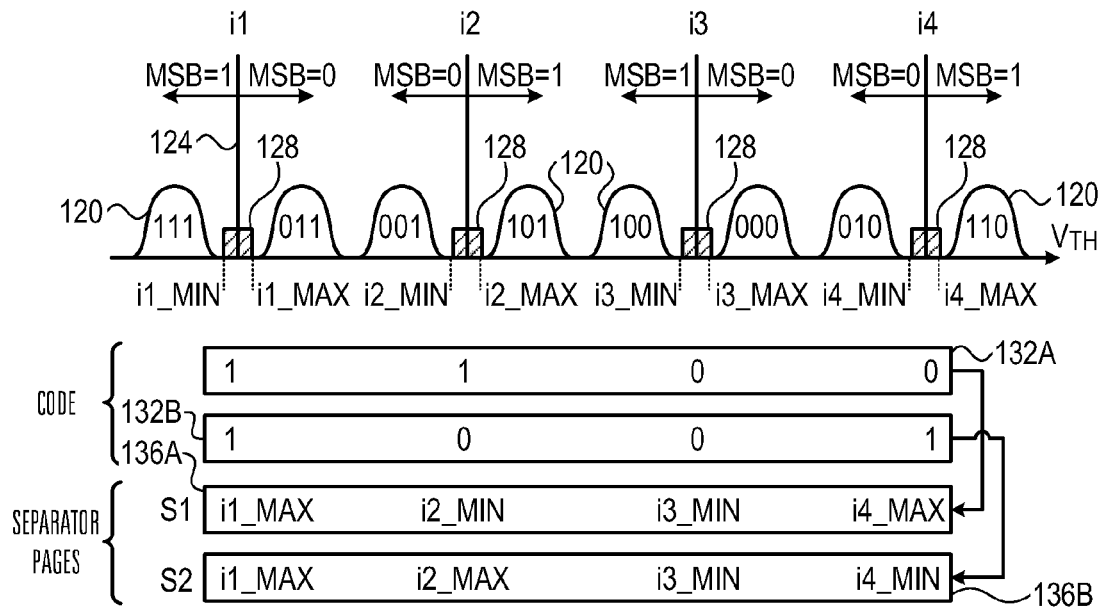
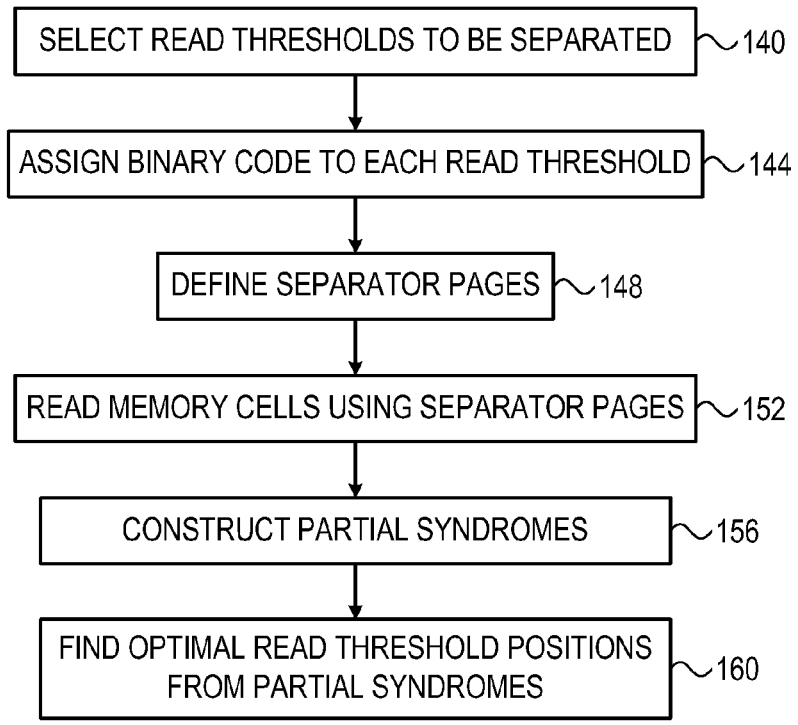
FIG. 6
FIG. 7

OPTIMIZED THRESHOLD SEARCH IN ANALOG MEMORY CELLS USING SEPARATOR PAGES OF THE SAME TYPE AS READ PAGES

CROSS-REFERENCE TO RELATED APPLICATIONS

This application is a continuation in part of U.S. patent application Ser. No. 13/595,571, filed Aug. 27, 2012, which claims the benefit of U.S. Provisional Patent Application 61/580,673, filed Dec. 28, 2011. The disclosures of these related applications are incorporated herein by reference.

FIELD OF THE INVENTION

The present invention relates generally to memory devices, and particularly to methods and systems for setting thresholds for reading analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as analog storage values or analog values. In Flash memories, for example, each analog memory cell holds a certain amount of electrical charge. The range of possible analog values is typically divided into regions, each region corresponding to a programming state or programming level that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference.

Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Various techniques for setting read thresholds and other read parameters for reading analog memory cells are known in the art. For example, U.S. Patent Application Publication 2009/0199074, whose disclosure is incorporated herein by reference, describes a method for operating a memory that includes analog memory cells. The method includes encoding data with an Error Correction Code (ECC) that is representable by a plurality of equations. The encoded data is stored in a group of the analog memory cells by writing respective input storage values to the memory cells in the group. Multiple sets of output storage values are read from the memory cells in the group using one or more different, respective read parameters for each set. Numbers of the equations, which are satisfied by the respective sets of the output storage values, are determined. A preferred setting of the read parameters is identified responsively to the respective numbers of the satisfied equations. The memory is operated on using the preferred setting of the read parameters.

SUMMARY OF THE INVENTION

An embodiment that is described herein provides a method including reading a group of analog memory cells using first explicit read thresholds, to produce first readout results. The group is re-read using second explicit read thresholds, to produce second readout results. The group is read using one or more sets of auxiliary thresholds so as to produce auxiliary readout results, such that the number of the auxiliary thresholds in each set is the same as the number of the first explicit read thresholds and the same as the number of the second explicit read thresholds. A readout performance of third read thresholds, which include at least one of the first explicit read thresholds and at least one of the second explicit read thresholds, is evaluated using the first, second and auxiliary readout results.

In some embodiments, the auxiliary thresholds in each set lie in respective intervals of analog values stored in the memory cells, and the method includes setting the auxiliary thresholds in each set to a respective different combination of lower and upper edges of the respective intervals. In an embodiment, setting the auxiliary thresholds includes assigning a respective different binary code to each of the intervals, and choosing between the lower and upper edges of the intervals depending on the binary code.

In another embodiment, evaluating the readout performance includes identifying, using the auxiliary readout results, subsets of the memory cells whose analog values fall in the respective intervals, and assessing the readout performance using the identified subsets. In an example embodiment, assessing the readout performance includes deriving from the identified subsets third readout results that would be produced by reading the group using the third read thresholds, and assessing the readout performance based on the third readout results.

In an alternative embodiment, the group stores data that is encoded with an Error Correction Code (ECC) that is representable by multiple check equations, and assessing the readout performance includes assessing a count of the check equations that are satisfied by the third readout results. In yet another embodiment, the group stores data that is encoded with an Error Correction Code (ECC) that is representable by multiple check equations, and assessing the readout performance includes deriving from the identified subsets respective partial syndromes of the ECC and assessing the readout performance using the partial syndromes.

In some embodiments, the method includes selecting optimal read thresholds based on the evaluated readout performance. Selecting the optimal read thresholds may include choosing the optimal read thresholds from among the first explicit read thresholds, the second explicit read thresholds and the third read thresholds. Additionally or alternatively, selecting the optimal read thresholds may include choosing the optimal read thresholds from among the first explicit read thresholds, the second explicit read thresholds, the third read thresholds, and the sets of the auxiliary thresholds.

There is additionally provided, in accordance with an embodiment of the present invention, apparatus including an interface and storage circuitry. The interface is configured to communicate with a memory including multiple analog memory cells. The storage circuitry is configured to read a group of the analog memory cells using first explicit read thresholds so as to produce first readout results, to re-read the group using second explicit read thresholds so as to produce second readout results, to read the group using one or more sets of auxiliary thresholds so as to produce auxiliary readout results, such that the number of the auxiliary thresholds in each set is the same as the number of the first explicit read thresholds and the same as the number of the second explicit read thresholds, and to evaluate a readout performance of third read thresholds, which include at least one of the first explicit read thresholds and at least one of the second explicit read thresholds, using the first, second and auxiliary readout results.

The present invention will be more fully understood from the following detailed description of the embodiments thereof, taken together with the drawings in which:

BRIEF DESCRIPTION OF THE DRAWINGS

FIG. 6 is a diagram that schematically illustrates a scheme for producing auxiliary thresholds, in accordance with an embodiment of the present invention;

FIG. 7 is a flow chart that schematically illustrates a method for selecting optimal read thresholds, in accordance with an embodiment of the present invention.

DETAILED DESCRIPTION OF EMBODIMENTS

Overview

Figure 1:
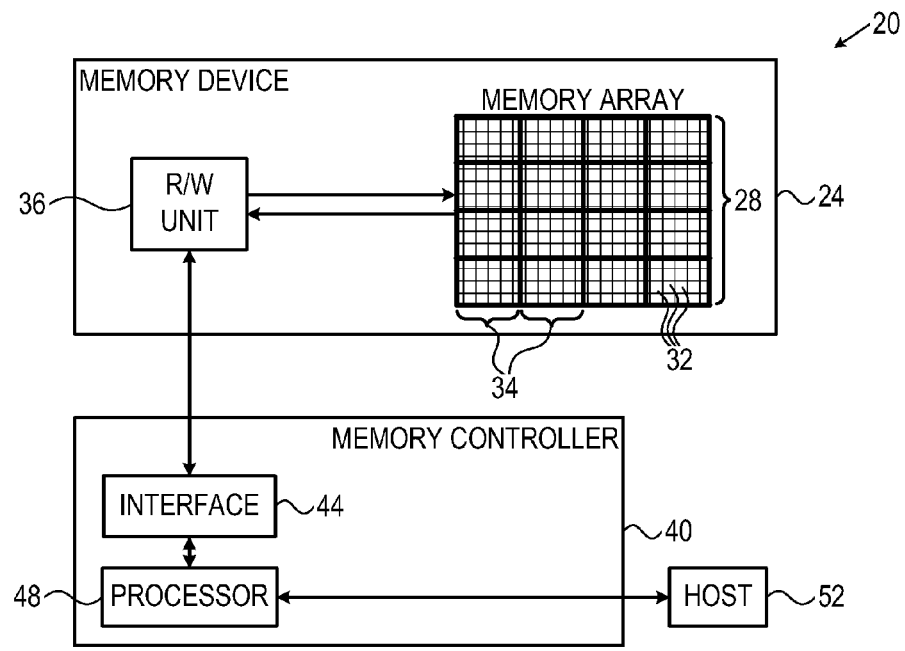
FIG. 1 is a block diagram that schematically illustrates a memory system, in accordance with an embodiment of the present invention.

Data is typically stored in analog memory cells by writing into the cells respective analog storage values that represent the data. The range of analog storage values is typically divided into regions, referred to as programming levels, which represent the possible data values. The analog memory cells are typically read by comparing their analog storage values to certain read thresholds that are positioned at the boundaries between adjacent programming levels.

In many practical cases, the analog storage values of the memory cells vary over time and from one memory cell group to another. Therefore, it is important to track and position the read thresholds with high accuracy. Accurate positioning of read thresholds has a considerable impact on the probability of read errors.

On the other hand, evaluation of multiple sets of read thresholds may incur considerable latency and power consumption, for example because this task involves a large number of read operations from the memory cells. The evaluation of read thresholds becomes particularly complex when using high-order MLC that store large numbers of bit per cell.

Embodiments of the present invention that are described herein provide improved methods and systems for evaluating read thresholds. The disclosed techniques evaluate the readout performance of multiple sets of read thresholds while actually reading the memory cells using only a small subset of these sets. The readout performance of the remaining sets of read thresholds is evaluated by computation, without actually reading the memory cells. As a result, the latency and power consumption incurred by the threshold evaluation process is reduced considerably. The best-performing set of read thresholds is then used for recovering the stored data.

In some embodiments, a memory controller reads a group of analog memory cells using two or more sets of read thresholds, referred to as explicit thresholds. Based on the readout results obtained using the explicit thresholds, the memory controller evaluates by computation the readout performance of various hybrid sets of read thresholds. Each hybrid set is made-up of individual thresholds selected from the explicit sets.

In some disclosed embodiments, the memory controller evaluates the performance of the hybrid sets by reading the group of memory cells using one or more sets of auxiliary thresholds. By proper setting of the auxiliary thresholds, the readout results obtained using the auxiliary thresholds are indicative of the exact relations between the cell analog values and the various individual explicit thresholds. The information provided by the auxiliary threshold thus enables the memory controller to evaluate the readout performance of hybrid sets of thresholds without explicit readout using these sets.

In particular, some disclosed techniques use sets of auxiliary thresholds that are of the same MLC bit significance as the explicit sets. In other words, the number of auxiliary thresholds in each set is the same as the number of thresholds in each explicit set. Put in yet another way, the auxiliary thresholds and the explicit thresholds are all read using the same type of page readout command (e.g., an MSB read command) that simultaneously applies a given number of read thresholds.

The above feature is important, for example, because in some MLC devices there are unknown deviations between the scales of thresholds of different bit significance. Unless the auxiliary thresholds are of the same bit significance as the explicit thresholds, such deviations may alter the order relations between the auxiliary thresholds and the explicit thresholds, and thus cause erroneous threshold setting.

In some embodiments that are described herein, the memory controller sets the appropriate auxiliary thresholds by assigning each auxiliary threshold a respective different binary code. The code indicates, for each auxiliary threshold in a given set, whether to set the auxiliary threshold at the lower or upper edge of an analog value interval between adjacent programming levels. This technique is explained and demonstrated below.

In some embodiments, there is clear distinction between auxiliary and explicit thresholds that are used for reading the stored data. In other embodiments, the same threshold sets serve both as explicit thresholds and as auxiliary thresholds. The trade-offs between the two implementations is discussed below.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes several example techniques for selecting read thresholds for reading the data stored in memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W circuitry in any suitable manner, or performed by any one of these elements. Thus, in the context of the present patent application and in the claims, memory controller and R/W circuitry 36 are referred to jointly as storage circuitry that carries out the disclosed techniques.

Figure 2:
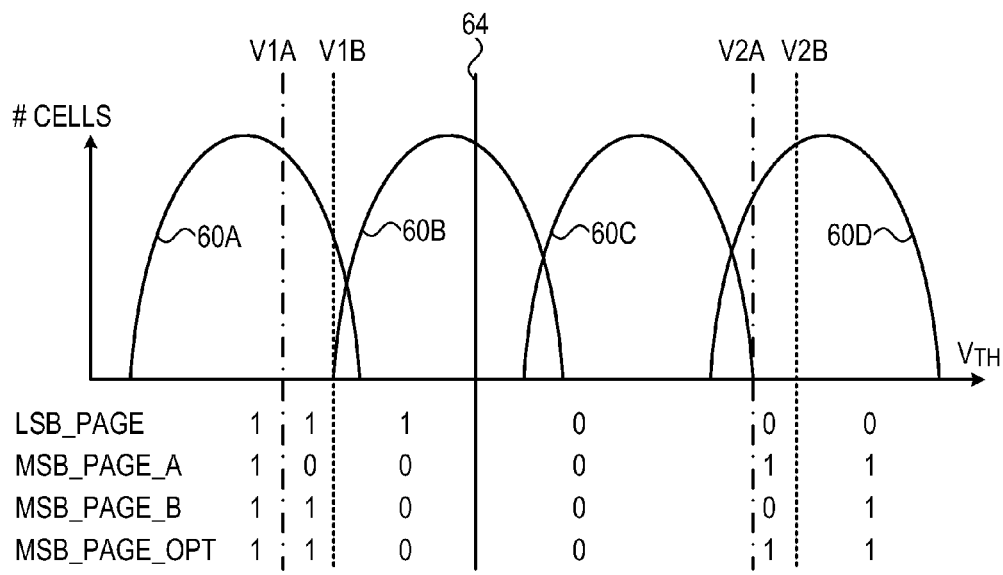
FIGS. 2 and 3 are diagrams that schematically illustrate schemes for selecting optimal read thresholds, in accordance with embodiments of the present invention.

FIG. 2 is a diagram that schematically illustrates a scheme for selecting optimal read thresholds, in accordance with an embodiment of the present invention. In the present embodiment, memory cells 32 comprise four-level MLC, each holding two data bits. In alternative embodiments, the disclosed techniques can be used for selecting read thresholds for reading any other suitable type of MLC, such as eight-level or sixteen-level MLC.

In the example of FIG. 2, a group of memory cells, typically along a given word line, holds two data pages—A page referred to as Least Significant Bit (LSB) page in the first bit of the memory cells in the group, and another page referred to as Most Significant Bit (MSB) page in the second bit of the memory cells in the group.

The figure shows the threshold voltage ($V_{TH}$) distribution in the memory cells in the group. In this example, the threshold voltage is distributed in four distributions 60A . . . 60D that correspond to four respective programming levels. Each programming level represents a respective combination of two bits—An LSB and an MSB:

TABLE 1

Example mapping of LSB and MSB to programming levels

| Programming level | LSB | MSB |
|---|---|---|
| 60A | 1 | 1 |
| 60B | 1 | 0 |
| 60C | 0 | 0 |
| 60D | 0 | 1 |

This mapping uses Gray coding, in which any two adjacent programming levels differ from one another by only a single bit value. Moreover, in this mapping the lowest two programming levels correspond to LSB="1", and the highest two programming levels correspond to LSB="0".

Typically, R/W unit 36 reads the LSB page by comparing the cell threshold voltages to an LSB read threshold 64. Memory cells whose threshold voltage falls below threshold 64 are regarded as holding LSB="1", and memory cells whose threshold voltage falls above threshold 64 are regarded as holding LSB="0".

Unit 36 typically reads the MSB page by comparing the cell threshold voltages to a pair of MSB read thresholds V1A and V2A, or to a pair of MSB read thresholds V1B and V2B. Memory cells whose threshold voltage falls between V1A and V2A (or between V1B and V2B) are regarded as holding MSB="0", and memory cells whose threshold voltage falls below threshold V1A or above threshold V2A (or, alternatively, below threshold V1B or above threshold V2B) are regarded as holding LSB="1".

In practice, the shapes and positions of distributions 60A . . . 60D may vary over time and from one group of memory cells to another. Accurate positioning of the read thresholds has a considerable impact on the probability of read errors, especially when the programming level distributions are closely spaced or even partially overlapping. Since the boundary regions between distributions vary over time and between memory cell groups, the read threshold positions should typically be adjusted in an adaptive manner.

Read Threshold Search with Reduced Number of Read Operations

As can be seen in FIG. 2, each MSB readout operation involves comparison with a pair of read thresholds. In order to find the optimal positions of the MSB read thresholds, it is typically necessary to evaluate multiple candidate pairs of read thresholds and choose the best-performing pair.

An exhaustive search over multiple pairs of thresholds may involve a large number of readout operations in which the memory cell threshold voltages are sensed and compared to the thresholds of each pair, and may therefore incur considerable latency and power consumption. In some embodiments that are described herein, memory controller 40 evaluates the readout performance of multiple sets of read thresholds, while performing only a small number of read operations from memory cells 32. As a result, processing time and power consumption are reduced.

In the present example, the memory controller reads the memory cells in the group twice—Using the read threshold pair {V1A,V2A} and using the read threshold pair {V1B, V2B}. Based on the results of these two readout operations, the memory controller evaluates the readout performance of two additional pairs of read thresholds—{V1A,V2B} and {V1B,V2A}, without reading the memory cells using these read threshold pairs. Thus, the number of read operations is reduced by half in comparison with a conventional readout of {V1A,V2A}, {V1B,V2B}, {V1A,V2B} and {V1B,V2A}.

The sets of read thresholds with which the memory cells are actually read (pairs {V1A,V2A} and {V1B,V2B} in this example) are referred to herein as explicit sets of thresholds or simply explicit thresholds. The additional sets of thresholds (pairs {V1A,V2B} and {V1B,V2A} in this example), which are computed based on the explicit threshold, are referred to herein as hybrid sets of read thresholds, or hybrid thresholds for brevity.

After evaluating the readout performance of the various read threshold pairs, including the explicit thresholds and the hybrid thresholds, the memory controller selects the pair of read thresholds that exhibits the best readout performance. The selected pair of read thresholds (either explicit or hybrid) is used for recovering the data stored in the group of memory cells.

For a 2 bits/cell memory, the disclosed techniques can use the readout results of N read operations (N sets of explicit thresholds) to estimate the readout performance of $N^2$ pairs of read threshold combinations ($N^2$ sets of hybrid thresholds). When evaluating a larger number of threshold pairs, or when using higher-order MLC, the reduction in the number of read operations is considerably higher.

The example of FIG. 2 demonstrates the effectiveness of this technique. In this example, the two pairs of explicit thresholds ({V1A,V2A} and {V1B,V2B}) are not positioned optimally in the boundaries between the threshold voltage distributions. The hybrid pair {V1B,V2A}, however, is much better positioned. Even though the memory cells are never actually read using the hybrid pair {V1B,V2A}, the memory controller evaluates its readout performance from the readout results of the explicit threshold pairs {V1A,V2A} and {V1B, V2B}. The memory controller is then able to select the hybrid pair {V1B,V2A} for subsequent data recovery.

In the example of FIG. 2, memory controller 40 uses the readout results of the explicit pairs ({V1A,V2A} and {V1B, V2B}) to artificially construct the readout results of the hybrid pairs ({V1A,V2B} and {V1B,V2A}) without actually reading the memory cells using the hybrid pairs. For this purpose, the memory controller reads the memory cells using one or more auxiliary thresholds.

In some embodiments, LSB threshold 64 serves as an auxiliary threshold. The readout results of auxiliary threshold 64 ("0" or "1") are denoted LSB_PAGE in the figure, and are shown as a function of the $V_{TH}$ interval in which the cell threshold voltage falls.

The MSB readout results of explicit pair {V1A,V2A} are shown on the following line, denoted MSB_PAGE_A. The next line, marked MSB_PAGE_B, shows the readout results of explicit pair {V1B,V2B}. Note that in two intervals (V1A<$V_{TH}$<V1B and V2A<$V_{TH}$<V2B) there is a disagreement between the readout results of the explicit pairs.

In this embodiment, the memory controller constructs the artificial readout results of hybrid pair {V1B,V2A} from the readout results of the two explicit pairs of read thresholds, using the readout results of the auxiliary threshold 64. The artificial readout results of hybrid pair {V1B,V2A} are shown at the bottom of FIG. 2, marked MSB_PAGE_OPT. When the respective readout results of the explicit pairs agree (i.e., both "0" or both "1") the memory controller sets the corresponding readout result of the hybrid pair to this value. When the respective readout results of the explicit pairs disagree, the memory controller sets the corresponding readout result of the hybrid pair to one of these values, depending on the corresponding readout result of the auxiliary threshold.

Because of the mapping of bits to programming levels (Table 1 above), the bits of LSB_PAGE indicate which memory cells have threshold voltages that fall on the left-hand-side of threshold 64 (LSB_PAGE="1") and which have threshold voltages that fall on the right-hand-side of threshold 64 (LSB_PAGE="0").

Thus, in order to recreate the readout results of {V1B, V2A}, the memory controller sets the readout result of MSB_PAGE_OPT to the corresponding readout result of MSB_PAGE_A if the corresponding LSB_PAGE readout result is "0" (imitating a comparison to V2A). If, on the other hand, the LSB_PAGE readout result is "1", the memory controller sets the readout result of MSB_PAGE_OPT to the corresponding readout result of MSB_PAGE_B (imitating a comparison to V1B).

The above logic reconstructs the exact readout results that would be produced by reading the memory cells in the group using the hybrid thresholds {V1B,V2A} (other than the possible effects of read noise) without actually reading the memory cells using this hybrid pair. The artificial readout results of the second hybrid pair {V1A,V2B}) can be constructed in a similar manner.

Note that this technique is not sensitive to the accuracy with which LSB threshold 64 is positioned, because threshold voltages that are close to LSB threshold 64 are far from any of the MSB thresholds (and therefore their bit values are the same in MSB_PAGE_A and MSB_PAGE_B). As can be seen in the figure, threshold 64 is not positioned optimally between programming levels 60B and 60C. Nevertheless, the construction of the artificial MSB_PAGE_OPT readout results is still accurate.

The disclosed technique can be used in a similar manner with sets of more than two read thresholds. Consider, for example, a group of 3 bits/cell memory cells storing an LSB page, a Center Significance Bit (CSB) page and an MSB page using the following bit mapping and read threshold configuration:

TABLE 2

Example 3 bits/cell configuration

| Programmed pages | Data value | $V_{TH}$ range |
|---|---|---|
| LSB | "1" | $V_{TH} < RV_{11}$ |
|  | "0" | $V_{TH} > RV_{11}$ |
| LSB, CSB | "11" | $V_{TH} < RV_{21}$ |
|  | "10" | $RV_{21} < V_{TH} < RV_{22}$ |
|  | "00" | $RV_{22} < V_{TH} < RV_{23}$ |
|  | "01" | $V_{TH} > RV_{23}$ |
| LSB, CSB, MSB | "111" | $V_{TH} < RV_{31}$ |
|  | "110" | $RV_{31} < V_{TH} < RV_{32}$ |
|  | "100" | $RV_{32} < V_{TH} < RV_{33}$ |
|  | "101" | $RV_{33} < V_{TH} < RV_{34}$ |
|  | "001" | $RV_{34} < V_{TH} < RV_{35}$ |
|  | "000" | $RV_{35} < V_{TH} < RV_{36}$ |
|  | "010" | $RV_{36} < V_{TH} < RV_{37}$ |
|  | "011" | $V_{TH} > RV_{37}$ |

In this example, the MSB page is read using a set of four MSB thresholds denoted {$RV_{31}$,$RV_{33}$,$RV_{35}$,$RV_{37}$}. Assume that the MSB page is read twice using two explicit sets of thresholds {V1A,V2A,V3A,V4A} and {V1B,V2B,V3B,V4B}. In order to construct the readout results of a hybrid set {V1A,V2B,V3A,V4B}, the memory controller may first read the LSB and the CSB pages (where low accuracy of the read thresholds is sufficient, as described above). Then, the value of the LSB and CSB (auxiliary thresholds) determines for each cell which is the relevant MSB threshold (V1,V2,V3 or V4).

According to the value of the LSB and CSB bits, the memory controller selects either the bit from the first or second MSB read operation. For example, if a cell has LSB and CSB bits of "0", then the relevant threshold is $RV_{35}$→V3. Since the memory controller needs the artificial readout results to use V3A, it will select the result of the first readout. If a cell has an LSB bit of "0" and a CSB bit of "1", then the relevant threshold is $RV_{37}$→V4. Since the memory controller needs the artificial readout results to use V4B, we will select the result of the second readout.

In some embodiments, the read threshold values in the various explicit sets are unique. In alternative embodiments, however, multiple explicit and/or hybrid sets may use a given threshold value.

Note that, in many practical cases, the auxiliary read thresholds do not require additional read operations. In the configuration of FIG. 2, for example, the normal LSB readout used for recovering the LSB page data can be re-used as auxiliary threshold readout. In the 3 bits/cell example, too, normal LSB and CSB readout operations can be re-used as auxiliary threshold readout.

Figure 3:
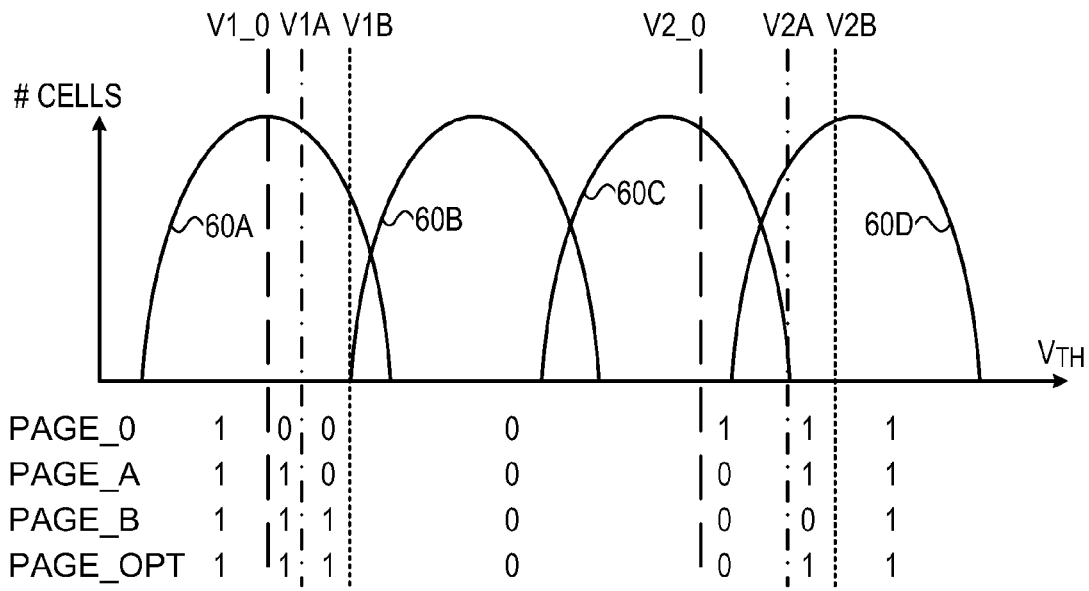

FIG. 3 is a diagram that schematically illustrates a scheme for selecting optimal read thresholds, in accordance with an alternative embodiment of the present invention. In the scheme of FIG. 2 above, the memory controller generated the artificial readout results for the hybrid threshold sets using one or more auxiliary thresholds. In the scheme of FIG. 3, on the other hand, one of the explicit sets of read thresholds serves as the auxiliary thresholds.

In the example of FIG. 3, memory controller 40 reads the group of memory cells using three explicit sets of read thresholds denoted {V1_0,V2_0}, {V1A,V2A} and {V1B,V2B}, so as to generate three pages denoted PAGE_0, PAGE_A and PAGE_B, respectively. From the readout results of these three read operations, the memory controller recreates the artificial readout results of all nine possible combinations threshold pairs (i.e., produces six artificial readout results for six hybrid threshold pairs).

In this embodiment, the memory controller uses one of the explicit pairs (in this example {V1_0,V2_0}) as the auxiliary thresholds. This technique can be used, for example, if the LSB page is not available. One advantage of this technique is that it eliminates the need for a dedicated read operation using the auxiliary thresholds, and instead reuses the read results of one of the explicit pairs. As a result, better throughput can be achieved.

The description that follows assumes that the lowest among the explicit thresholds are chosen to serve as the auxiliary thresholds, i.e., that V1_0≤V1A, V1_0≤V1B, V2_0≤V2A and V2_0≤V2B. In alternative embodiments, however, the highest among the explicit thresholds may be chosen to serve as the auxiliary thresholds.

In an embodiment, in order to artificially generate the readout results of hybrid pair {V1B,V2A} (denoted PAGE_OPT in the figure), the memory controller applies the following logic:

For memory cells in which PAGE_0="0", set the corresponding readout result in PAGE_OPT to be the readout result of PAGE_B.

For memory cells in which PAGE_0="1", set the corresponding readout result in PAGE_OPT to be the readout result of PAGE_A.

In order to artificially generate the readout results of hybrid pair that mixes a threshold from {V1_0,V2_0} with a threshold from {V1A,V2A}, the memory controller may still use PAGE_0 (the readout results of {V1_0,V2_0}) to serve as auxiliary thresholds. Thus, the three readout operations {V1_0,V2_0}, {V1A,V2A} and {V1B,V2B} can be used to produce a total of nine sets of readout results.

As yet another example, consider the case of two explicit read operations, in which the memory controller generates four possible combinations. The memory controller may read the group of memory cells using {V1_0,V2_0} and {V1A, V2A}, and use PAGE_0 as the auxiliary threshold. In this case, the thresholds should be ordered (without loss of generality) such that V1_0≤V1A and V2_0≤V2A.

Figure 4:
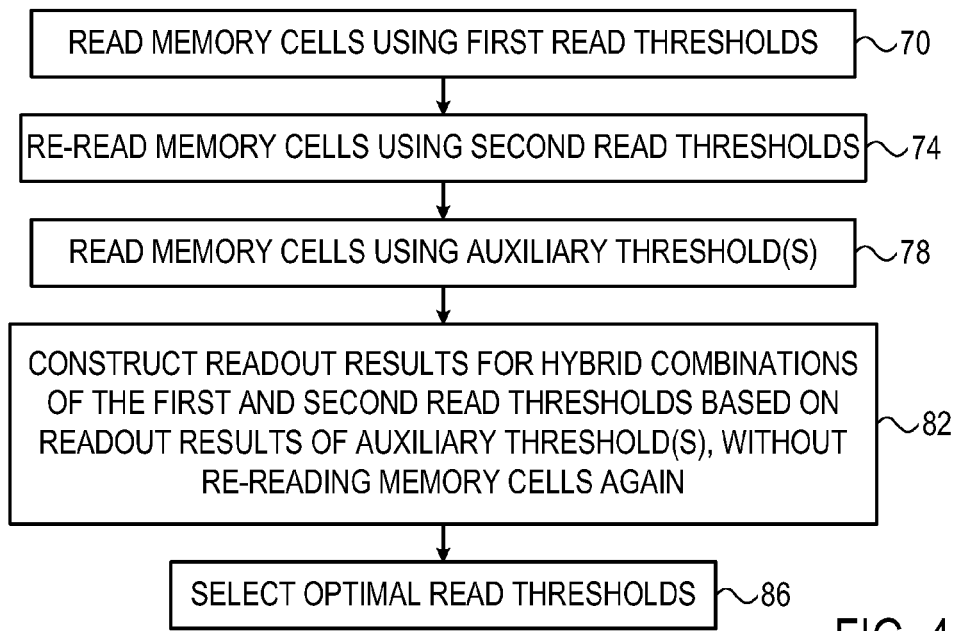
FIGS. 4 and 5 are flow charts that schematically illustrate methods for selecting optimal read thresholds, in accordance with embodiments of the present invention.

FIG. 4 is a flow chart that schematically illustrates a method for selecting optimal read thresholds, in accordance with an embodiment of the present invention. The method begins with memory controller 40 reading a group of analog memory cells 32 using first explicit read thresholds, at a first readout step 70. The memory controller re-reads the same group of memory cells using second explicit read thresholds, at a second readout step 74.

The memory controller reads the group of memory cells using one or more auxiliary thresholds, at an auxiliary readout step 78. As explained above, the memory controller may reuse one of the explicit readout operations (e.g., at step 70 or 74) to serve as the auxiliary readout operation.

The memory controller uses the readout results of the explicit read thresholds, and the corresponding readout results of the auxiliary threshold(s), to artificially produce readout results for one or more hybrid sets of read thresholds, at a hybrid result generation step 82. Each hybrid set of thresholds comprises at least one threshold selected from the first read thresholds, and at least one threshold selected from the second read thresholds.

Using the multiple readout results, memory controller 40 evaluates the readout performance of the various explicit and hybrid sets of read thresholds, at an optimal threshold selection step 86. Typically, the memory controller selects the set of read thresholds (explicit or hybrid) having the best readout performance, and uses this set for recovering the data stored in the group of memory cells.

In various embodiments, memory controller 40 may evaluate the readout performance in different ways and use different criteria to select the best-performing set of read thresholds. In some embodiments, the data stored in the group of memory cells is encoded with an Error Correction Code (ECC) that is defined by a set of parity check equations. The ECC may comprise, for example, a Low Density Parity Check (LDPC) code, or any other suitable type of ECC.

In some embodiments, for each set of readout results, the memory controller calculates the number (count) of satisfied parity check equations. The set of read thresholds (explicit or hybrid) that produces the readout results having the largest count of satisfied parity check equations is regarded as the best-performing set. Additional aspects of setting read thresholds based on the number of satisfied parity check equations are addressed in U.S. Patent Application Publication 2009/0199074, cited above. This criterion is also referred to as "syndrome sum" (the weight of the syndrome vector, i.e., the sum of locations where the syndrome is equal to 1 and not 0)—Minimizing the syndrome sum is equivalent to finding the readout results having the largest number of satisfied parity check equations.

In alternative embodiments, the memory controller may attempt to decode the ECC for the readout results (whether read or artificially reproduced) of each set of read thresholds (explicit or hybrid). Success or failure to decode the ECC for a given set of readout results is used as an indication of the readout performance of the corresponding set of read thresholds. In an example flow, the memory controller carries out an iterative process of testing additional sets of read thresholds, including both explicit and hybrid sets, until successfully decoding the ECC.

In other embodiments, the memory controller may begin to decode the ECC for the readout results (whether read or artificially reproduced) of each set of read thresholds (explicit or hybrid). When decoding the ECC for a given set of read thresholds, the memory controller may use some interim result of the ECC decoding process as an indication of the readout performance of the corresponding set of read thresholds.

Consider, for example, a configuration in which the stored data is encoded with a Bose-Chaudhuri-Hocquenghem (BCH) code. In a typical BCH decoding process, the decoder calculates an Error Locator Polynomial (ELP), and then locates the errors by finding the roots of the ELP. The rank of the ELP, which is available early in the BCH decoding process, is indicative of the number of errors in the code word. In such embodiments, the memory controller may use the rank of the ELP as an indication of the readout performance of the read thresholds. The memory controller may proceed from this stage. Alternatively, the memory controller may continue to evaluate another set of read threshold without completing the decoding process, even if the previous read results are decodable.

As another example, the ECC may comprise a Turbo Product Code (TPC), in which the data is arranged in a matrix, and each row and column is encoded individually with some auxiliary ECC such as a Hamming code. In these embodiments, the memory controller may decode the auxiliary code only for a subset of the rows and columns of the matrix, and use the decoding results as an indication of readout performance of the read thresholds.

Alternatively to TPC, other types of ECC can also be viewed as a composite ECC comprising multiple component ECCs. The disclosed techniques can be used, mutatis mutandis, with any such ECC. For example, a product code can be defined in more than two dimensions, such as in three dimensions. In an example three-dimensional code, data is arranged in a cube of k·k·k bits, and every k bits in each dimension are encoded into n bits using a component code to generate an n·n·n-bit codeword. Another possible generalization of a two-dimensional product code is to encode the diagonals of the data matrix as a "virtual" $3^{rd}$ dimension, in addition to encoding the rows and columns. As yet another example, a product code can be shortened by refraining from transmitting or storing part of the data bits.

In another embodiment, the disclosed techniques can be used with Generalized Low Density Parity Check (G-LDPC) codes, which can also be viewed as a composite ECC that is made-up of component codes. A G-LDPC code can be described by a Tanner graph. Each check node of this graph, instead of representing a simple parity check equation, represents an ECC (such as Hamming, BCH, RS or convolutional code). A product code can be viewed as a special case of G-LDPC—the "generalized check node" in this case is a Hamming code parity check matrix, for example. The Tanner graph of such a G-LDPC code has all $n^2$ bit nodes on one side, and 2n check nodes on the opposite side. Each check node corresponds to a row or column of the matrix codeword. For example, all the bits of row 1 may be connected to a generalized check node, meaning that they are a valid Hamming codeword.

The disclosed techniques can be used with G-LDPC codes: Parameter estimation can be performed based on decoding of part of the generalized check nodes.

Further alternatively, memory controller 40 may evaluate the performance of a given set of read thresholds by estimating the Cumulative Distribution Function (CDF) of the storage values of the relevant memory cells. For example, the memory controller may count the number of "1" readout results in a given group of memory cells and select the read thresholds that make this number closest to a predefined reference number. Examples of CDF-based methods for read threshold adjustment are described, for example, in U.S. Patent Application Publication 2010/0091535, whose disclosure is incorporated herein by reference.

Further alternatively, memory controller 40 may evaluate the readout performance of the various sets of read thresholds, and select the best-performing set of read thresholds, using any other suitable criterion.

When using an ECC that is decoded by syndrome calculation, the memory controller may attempt to decode the ECC based on some hybrid set of read thresholds, and calculate the error vector using the syndrome. If successful, the memory controller may regenerate the read results, and combine them with the error vector so as to produce error-corrected read results.

Generally, the memory controller may continue to evaluate additional sets of read thresholds (explicit of hybrid) even though the data is decodable from a previous set of read results, for example in order to find the best-performing set of read thresholds. In one example embodiment, the current page may be read and decoded using a set of read thresholds that is not necessarily optimal, and the optimal read thresholds will be used for future read operations.

In various embodiments, once the memory controller has identified the best-performing set of read thresholds, it will attempt to decode the ECC based on the readout results obtained using this set. The decoding process used by the memory controller may comprise a hard decoding process or a soft decoding process. In some embodiments, the soft decoding process may involve additional read operations using read thresholds that are positioned in the vicinity of the best-performing set. Alternatively, however, a soft decoding process may operate on hard input, e.g., on hard readout results using only the best-performing threshold set.

In various embodiments, once the best-performing set of read thresholds is found, the memory controller may recover the data from the readout results obtained using these thresholds, if they exist. Alternatively, the memory controller may read the memory cells using the best-performing read thresholds and then recover the data from the readout results. Further alternatively, the memory controller may perform one or more additional read operations with read thresholds that are positioned in the vicinity of the best-performing read thresholds, and recover the data using the readout results of the additional read operations.

Efficient Read Threshold Search by Combining Partial ECC Syndromes from Different Read Operations The description that follows gives an alternative technique of generating artificial readout results for a hybrid set of read thresholds, based on readout results of explicit read thresholds. The disclosed technique is sometimes preferable over the techniques of FIGS. 2-4 above, for example because it does not require storage of the complete sets of readout results obtained using the various explicit read thresholds. This reduction in memory space may be especially significant in high-order MLC (e.g., three or four bits/cell) in which the number of explicit read thresholds (and thus the number of readout results) is high.

The disclosed technique is suitable for use with various criteria of evaluating the readout performance of each threshold set. In some embodiments, the disclosed technique can be used with criteria that are based on non-linear processing of a linear function of the data bits. The syndrome-sum criterion described above, for example, is such a criterion because the ECC syndrome is a linear function of the data bits, but the number of "1" values in the syndrome is a non-linear function of the syndrome.

The term "linearity" in the above paragraph refers to the following: The syndrome calculations are carried out using finite field algebra, and the syndrome is linear in the finite field in the sense that the syndrome of a sum (over the finite field) of two vectors equals the sum of the syndromes of the individual vectors. The syndrome sum, on the other hand, is calculated using algebra of natural numbers, where the binary symbols of the finite field are treated as natural numbers (0 or 1). The syndrome sum is non-linear in the sense that calculating it over the sum (over the finite field) of two bit vectors is not equivalent to adding the syndrome sum of the two individual vectors. The notations of addition and multiplication herein may refer to finite field algebra or to natural or real algebra, as appropriate.

Consider a group of 2 bits/cell memory cells having four programming levels such as the one shown in FIGS. 2 and 3 above, and assume that memory controller 40 reads the group using various explicit sets of MSB read thresholds. In some embodiments, instead of storing the entire vector of readout results for each set of explicit read thresholds, memory controller 40 computes and stores only two partial ECC syndromes.

Let H denote the parity check matrix of the ECC that is used for encoding the data stored in the group of memory cells, and let x denote a vector of MSB readout results using a certain explicit set of read thresholds. The full syndrome of x is defined as s=H·x. If x is a valid ECC code word, then s=H·x=0. Otherwise, the value of s is indicative of the number of parity check equations that are satisfied by x. Typically, the number of non-zero bits in the syndrome indicates the number of non-satisfied equations.

The two partial syndromes of readout results x are defined as $s_1 = H \cdot x_1$ and $s_2 = H \cdot x_2$, wherein $x_1$ denotes the vector of MSB values of the memory cells for which LSB="0" with the remaining bits nullified, and $x_2$ denotes the vector of MSB values of the memory cells for which LSB="1" with the remaining bits nullified. It can be shown that the sum of the partial syndromes is equal to the full syndrome, since $s = H \cdot x = H \cdot x_1 + H \cdot x_2$.

Typically, for each vector x of readout results produced using a certain explicit set of read thresholds, memory controller 40 divides the memory cells in the group into two subsets—One subset for which LSB="0" and another subset for which LSB="1". The memory controller may divide the memory cells by reading the group with an LSB threshold such as threshold 64 in FIG. 2 above. Alternatively, the memory controller may divide the memory cells into the two subsets using an MSB read operation, in accordance with the scheme of FIG. 3 above, or using any other suitable method.

Using this division, the memory controller generates vectors $x_1$ and $x_2$, and then computes the partial syndromes $s_1 = H \cdot x_1$ and $s_2 = H \cdot x_2$. At this stage, the memory controller may discard the raw read results (x, $x_1$ and $x_2$) and retain only the partial syndromes. This process is typically repeated for each explicit set of read thresholds.

The memory controller may use the stored partial syndromes to evaluate the full syndromes of various hybrid sets of read thresholds, which are formed using combinations of read thresholds from different explicit sets.

Consider, for example, two explicit MSB read operations, the first read operation using read thresholds {V1A,V2A} and the second read operation using read thresholds {V1B, V2B}. For the first read operation the memory controller computes and stores two partial syndromes denoted s1A and s2A. For the second read operation the memory controller computes and stores two partial syndromes denoted s1B and s2B. The memory controller can then compute the full syndrome for the hybrid set {V1A,V2B} by computing s1A+s2B. Similarly, the full syndrome for the hybrid set {V1B, V2A} is given by s1B+s2A.

Since the full syndrome (the sum of the partial syndromes) is indicative of the number of satisfied parity check equations, the memory controller may evaluate the readout performance of various (explicit or hybrid) sets of read thresholds by computing the respective full syndromes associated with these read thresholds. These full syndromes can be calculated by summing the appropriate partial syndromes that were computed for the explicit read thresholds. Typically, the memory controller selects the (explicit or hybrid) set of read thresholds having the smallest full syndrome sum. The selected set of read thresholds is then used for decoding the stored data.

Storing of partial syndromes instead of raw readout results provides considerable saving in memory space. Since the syndrome length is comparable with the ECC redundancy size, it is typically on the order of 3-10% of the data page size.

Although the disclosed technique was described for the case of MSB readout in a 2 bits/cell memory, this choice was made purely for the sake of conceptual clarity. In alternative embodiments, this technique can be used with any other suitable memory configuration. For a 3 bits/cell memory, for example, four partial syndromes are computed and stored for each explicit set of read thresholds.

Figure 5:
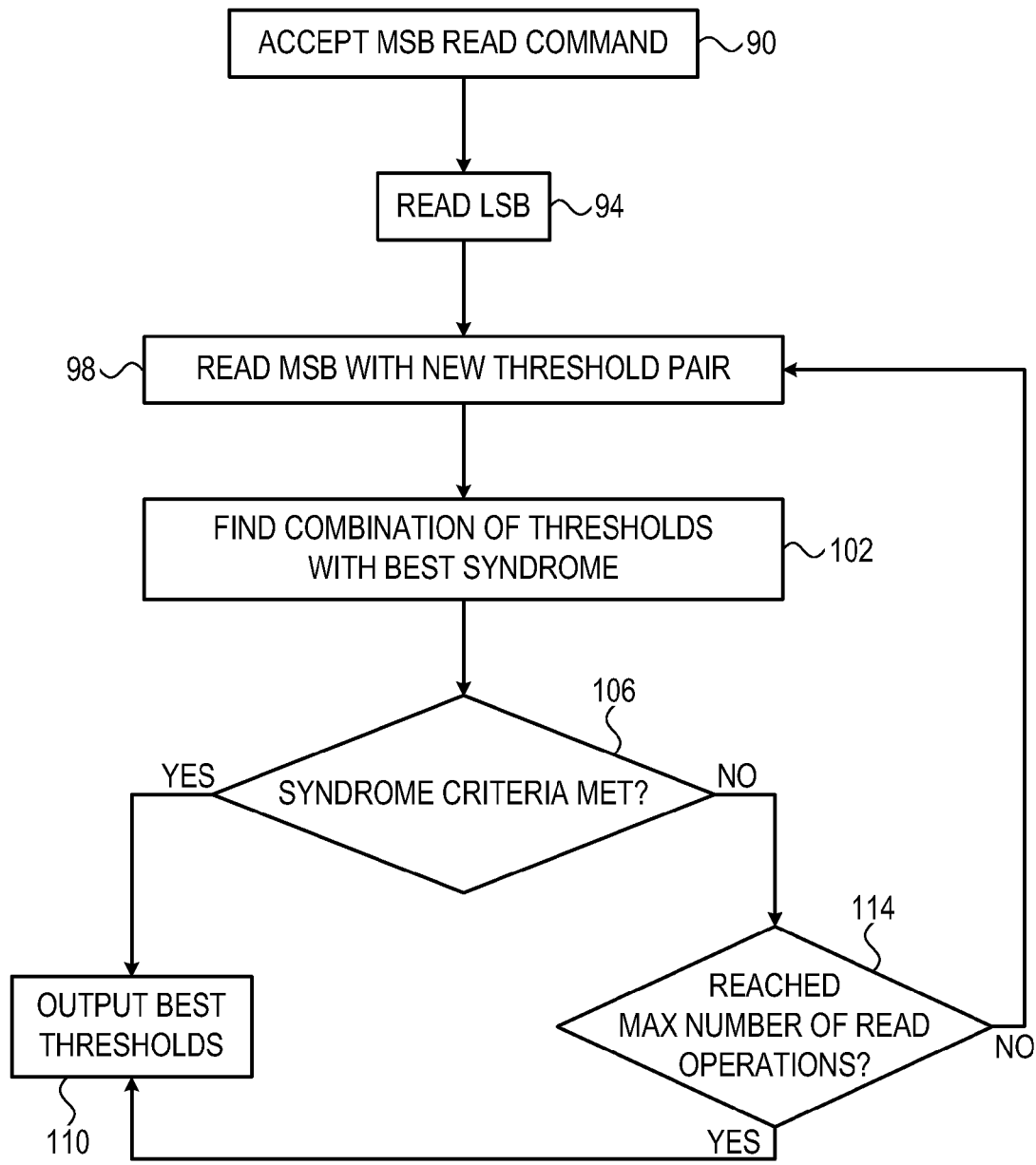

FIG. 5 is a flow chart that schematically illustrates a method for selecting optimal read thresholds, in accordance with an embodiment of the present invention. Although the embodiment described herein refers to partial syndromes, the technique of adding read operations until meeting a certain criterion is not limited for use with partial syndromes, and it is similarly applicable to the syndrome-sum-based method and other methods described above.

The method begins with memory controller 40 accepting an MSB read command from host 52, at a command input step 90. The MSB read command requests readout of the MSB page from a specified group of memory cells.

The memory controller reads the LSB page from the specified group of memory cells, at an LSB readout step 94. The memory controller uses the readout results of the LSB page to divide the memory cells in the group into two subsets, as explained above.

In each pass of the loop of FIG. 5, memory controller 40 reads the group of memory cells using an additional explicit set of MSB read thresholds, at an MSB readout step 98. The memory controller computes and stores the partial syndromes for the new set of explicit read thresholds.

The memory controller finds the (explicit or hybrid) set of read thresholds having the smallest full syndrome sum (sum of partial syndromes), at a syndrome sum minimization step 102. This set is the best-performing set that is achievable using the explicit readout results obtained so far.

The memory controller checks whether the full syndrome with minimal syndrome sum achieved so far meets a predefined criterion, at a criterion checking step 106. For example, the memory controller may compare the minimal syndrome sum achieved to an upper tolerable bound, and verify whether the syndrome sum of the best-performing syndrome is smaller than this bound.

If the minimal syndrome sym for the (full) syndrome is sufficiently small, the memory controller outputs the best-performing set of read thresholds (the set of read thresholds associated having the minimal syndrome sum), at an output step 110, and the method terminates.

Otherwise, the memory controller checks whether a maximum allowed number of read operations (a maximum allowed number of explicit read threshold sets) is reached, at a termination checking step 114. If the maximum allowed number of read operations has been reached, the memory controller outputs the best-performing set of read thresholds at step 110, and the method terminates. Otherwise, the method loops back to step 98 above in which the memory controller re-reads the group of memory cells with an additional explicit set of read thresholds.

In various alternative embodiments, the memory controller may decide how many explicit sets are to be used and which hybrid sets (combinations of read thresholds from the explicit sets) should be evaluated. Not all possible combinations need necessarily be tested.

The disclosed techniques are not limited to LDPC codes or to any particular type of ECC. For example, the methods and systems described herein can be used when the stored data is encoded with other types of ECC that are decoded using syndrome calculation, e.g., Bose-Chaudhuri-Hocquenghem (BCH), Reed-Solomon (RS) or Hamming codes.

When carrying out any of the methods described herein, memory controller 40 may combine the readout of multiple explicit sets of read thresholds in a single read command from the memory cells. Consider, for example, a 3 bit/cell memory device, which supports an MSB read commands that reads a group of memory cells using four read thresholds. The memory controller may evaluate two explicit sets of CSB read thresholds (each requiring two thresholds) using a single MSB read command. Additional aspects of readout using multi-threshold commands are addressed in U.S. Pat. No.

8,068,360, which is assigned to the assignee of the present patent application and whose disclosure is incorporated herein by reference.

Read Threshold Evaluation Using Separator Pages of the Same Type as the Read Pages In some of the embodiments described above, memory controller 40 evaluates hybrid sets of read thresholds using auxiliary thresholds and auxiliary read operations that correspond to lower bit significance relative to the data to be read. For example, in 2 bits/cell MLC, a hybrid set of MSB read thresholds can be evaluated using an auxiliary LSB read operation.

In some embodiments that are described below, memory controller 40 evaluates hybrid sets of read thresholds using auxiliary thresholds and auxiliary read operations that correspond to the same bit significance as the data to be read. In the examples given below, the memory controller evaluates hybrid sets of MSB thresholds in 3 bits/cell MLC, by performing auxiliary MSB read operations using auxiliary MSB thresholds. The disclosed techniques, however, can be used to evaluate hybrid thresholds of any desired bit significance in any suitable type of MLC.

FIG. 6 is a diagram that schematically illustrates a scheme for producing auxiliary thresholds (and thus producing separator pages), in accordance with an embodiment of the present invention. The figure shows the threshold voltage distribution in a group of 3 bits/cell MLC. In this example, eight programming levels 120 are defined, each programming level representing a respective three-bit data value. For example, the right-most programming level (marked "110") represents the data value {MSB=1, CSB=1, LSB=0}. The next programming level (marked "010") represents the data value {MSB=0, CSB=1, LSB=0}, and so on.

When using this configuration, the MSB page can be read from the group of memory cells using a set of four MSB read thresholds 124 denoted i1 . . . i4: Memory cells whose threshold voltage is below i1, or between i2 and i3, or above i4, are regarded as storing MSB=1. Memory cells whose threshold voltage is between i1 and i2, or between i3 and i4, are regarded as storing MSB=0.

This data mapping and threshold configuration is chosen purely by way of example, and the disclosed techniques can be used with any other suitable configuration. For example, the embodiments described herein refer mainly to LSB readout using one threshold, CSB readout using two thresholds and MSB readout using four thresholds. Alternatively, the disclosed techniques can be used, for example, with a mapping in which the LSB is read with one threshold, and the CSB and MSB are read with three thresholds each. Further alternatively, the disclosed techniques can be used with a mapping in which the LSB and CSB are read with two thresholds each, and the MSB is read with three thresholds.

In the present example, memory controller 40 reads the MSB page from the group of memory cells using two sets of explicit MSB thresholds denoted MSB_MIN={i1_MIN, i2_MIN, i3_MIN, i4_MIN} and MSB_MAX={i1_MAX, i2_MAX, i3_MAX, i4_MAX}. As can be seen in the figure, the read thresholds of MSB_MIN are positioned at the lower edges of respective intervals 128 around the nominal positions of the MSB thresholds. The read thresholds of MSB_MAX are positioned at the upper edges of intervals 128.

Using the technique described below, memory controller 40 is able to evaluate the readout results of any hybrid combination of the explicit thresholds, such as the readout results that would be obtained using {i1_MIN, i2_MIN, i3_MAX, i4_MAX} or {i1_MIN, i2_MAX, i3_MIN, i4_MAX}. A total of $2^4=16$ different hybrid sets of MSB thresholds can be evaluated in this manner, based on the two explicit readout operations of MSB_MIN and MSB_MAX. Although the embodiments described herein refer mainly to two sets of explicit thresholds, the disclosed techniques can be used for evaluating hybrid sets of thresholds that are selected from among any desired number of sets of explicit thresholds.

In some embodiments, the memory controller assigns each of MSB thresholds a respective two-bit binary code. (In the general case, for N thresholds, each binary code has $\lceil \log_2 N \rceil$ bits.) In the present example, the binary codes assigned to i1 . . . i4 are represented by two code words 132A and 132B, such that i1 is assigned the code $$\begin{bmatrix} 1 \\ 1 \end{bmatrix},$$

i2 is assigned the code $$\begin{bmatrix} 1 \\ 0 \end{bmatrix},$$

i3 is assigned the code $$\begin{bmatrix} 0 \\ 0 \end{bmatrix},$$

and i4 is assigned the code $$\begin{bmatrix} 0 \\ 1 \end{bmatrix}.$$

Alternatively, any other suitable code can be used.

The memory controller defines two sets of auxiliary thresholds 136A and 136B based on code words 132A and 132B, respectively. (In the general case, for N thresholds, there are $\lceil \log_2 N \rceil$ sets of auxiliary thresholds.) The readout results of reading the memory cells using the auxiliary thresholds are referred to as separator pages, since they are used for distinguishing between the effects of different explicit thresholds, as will be explained below.

In the present example, the memory controller defines a set of auxiliary thresholds from the respective code word in the following manner: The $k^{th}$ auxiliary threshold in the set is defined by the $k^{th}$ bit value in the code word. For odd values of k, if the $k^{th}$ bit is 1, i then the $k^{th}$ auxiliary threshold is chosen as ik_MAX, and if the $k^{th}$ bit is 0, then the $k^{th}$ auxiliary threshold is i chosen as ik_MIN. For even values of k, if the $k^{th}$ bit is i 1, then the $k^{th}$ auxiliary threshold is chosen as ik_MIN, and if the $k^{th}$ bit is 0, then the $k^{th}$ auxiliary threshold i is chosen as ik_MAX.

In other words, in each set of auxiliary thresholds, the code defines whether each auxiliary threshold is set to the lower or upper edge of the respective interval 128. This mapping is chosen by way of example. In alternative embodiments, any other suitable mapping of code words to auxiliary thresholds can be used.

Because of the above definition of the binary code and the auxiliary thresholds, the auxiliary readout results using auxiliary thresholds 136A and 136B (i.e., the two separator pages) will have the following properties:

For each memory cell whose threshold voltage falls within the interval between i1_MIN and i1_MAX, the corresponding pair of bits in the two separator pages will be $$\begin{bmatrix} 1 \\ 1 \end{bmatrix}.$$

For each memory cell whose threshold voltage falls within the interval between i2_MIN and i2_MAX, the corresponding pair of bits in the two separator pages will be $$\begin{bmatrix} 1 \\ 0 \end{bmatrix}.$$

For each memory cell whose threshold voltage falls within the interval between i3_MIN and i3_MAX, the corresponding pair of bits in the two separator pages will be $$\begin{bmatrix} 0 \\ 0 \end{bmatrix}.$$

For each memory cell whose threshold voltage falls within the interval between i4_MIN and i4_MAX, the corresponding pair of bits in the two separator pages will be $$\begin{bmatrix} 0 \\ 1 \end{bmatrix}.$$

For memory cells outside intervals 128, the auxiliary readout results do not affect the separation operation of the separator pages, since the readout results from these memory cells are the same when read with MSB_MIN and with MSB_MAX.

Consider the memory cells whose threshold voltage falls in the four intervals 128. From among these memory cells, the separator pages can be used for distinguishing between four subsets of memory cells whose threshold voltage falls in the intervals [i1_MIN,i1_MAX], [i2_MIN,i2_MAX], [i3_MIN, i3_MAX] and [i4_MIN,i4_MAX].

For example, for each memory cell whose threshold voltage falls in [i1_MIN,i1_MAX], the corresponding bit in the page S1·S2 is 1, wherein the operator X·Y denotes bit-wise AND between page X and page Y. Similarly, for each memory cell whose threshold voltage falls in [i2_MIN,i2_MAX], the corresponding bit in the page S1·$\overline{S2}$ is 1, wherein the operator $\overline{X}$ denotes bit-wise NOT of page X. For each memory cell whose threshold voltage falls in [i3_MIN,i3_MAX], the corresponding bit in the page $\overline{S1}\cdot\overline{S2}$ is 1. Finally, each memory cell whose threshold voltage falls in [i4_MIN,i4_MAX], the corresponding bit in the page $\overline{S1}$·S2 is 1.

In some embodiments, memory controller 40 produces the artificial readout results for a hybrid set of MSB thresholds by calculating $$U_{i1,i2,i3,i4}=S1\cdot S2\cdot u_{i1}+S1\cdot\overline{S2}\cdot u_{i2}+\overline{S1}\cdot\overline{S2}\cdot u_{i3}\overline{S1}S2\cdot u_{i4}$$

wherein $u_{ik}$ denotes a page (a vector of explicit readout results) read using the desired value of MSB threshold 124 ik, and the + operator here denoted bit-wise XOR.

Consider, for example, the two sets of explicit readout results MSB_MIN (read using {i1_MIN, i2_MIN, i3_MIN, i4_MIN}) and MSB_MAX (read using {i1_MAX,i2_MAX, i3_MAX, i4_MAX}). The memory controller can use the above techniques for producing the artificial readout results of any hybrid set of MSB thresholds chosen from MSB_MIN and MSB_MAX.

For example, the artificial readout results that would be obtained using {i1_MAX, i2_MAX, i3_MIN, i4_MIN} is given by S1·S2·MSB_MAX+S1·$\overline{S2}$·MSB_MAX+$\overline{S1}$·$\overline{S2}$·MSB_MIN+$\overline{S1}$·S2·MSB_MIN; the artificial readout results that would be obtained using {i1_MAX, i2_MIN, i3_MAX, i4_MIN} is given by S1·S2·MSB_MAX+S1·$\overline{S2}$·MSB_MIN+$\overline{S1}$·$\overline{S2}$·MSB_MAX+$\overline{S1}$·S2·MSB_MIN; and so on.

(All the examples above refer to readout using the ik_MIN and ik_MAX read thresholds. This choice, however, was made purely for the sake of conceptual clarity. The disclosed techniques can be performed using readout with any other suitable read thresholds having any suitable offsets in intervals 128.)

Memory controller 40 can evaluate the artificial readout results and select the optimal read thresholds in any desired way. For example, as explained above, the memory controller may compute the syndrome sum, i.e., the number of non-satisfied parity check equations, for each set of artificial readout results. The memory controller can then select the readout results (explicit or artificial) having the smallest syndrome sum.

In alternative embodiments, the memory controller uses the auxiliary readout results to compute partial ECC syndromes corresponding to each of i1 . . . i4. The memory controller can then compute a full syndrome for each set of hybrid thresholds by summing the appropriate partial syndromes. In an example embodiment, for each of the explicit readout results $u_{max}$ and $u_{min}$, the memory controller calculates each of the following partial syndromes:

$$\text{Synd}_{i,1}=H\cdot(S1\cdot S2\cdot u_i)$$

$$\text{Synd}_{i,2}=H\cdot(S1\cdot\overline{S2}\cdot u_i)$$

$$\text{Synd}_{i,3}=H\cdot(\overline{S1}\cdot\overline{S2}\cdot u_i)$$

$$\text{Synd}_{i,4}=H\cdot(\overline{S1}\cdot S2\cdot u_i)$$

The full syndrome of the hybrid set in question is then given by $\text{Synd}_{max,1}$ $\text{Synd}_{max,2}+\text{Synd}_{max,3}+\text{Synd}_{max,4}$, which can be calculated using combinatorial logic, wherein the + operator denotes bit-wise XOR.

Further alternatively, memory controller 40 may uses the auxiliary readout results to evaluate the performance of the hybrid read thresholds in any other suitable way.

FIG. 7 is a flow chart that schematically illustrates a method for selecting optimal read thresholds, in accordance with an embodiment of the present invention. The method begins with memory controller 40 selecting the read thresholds to be separated, at a selection step 140. In the example of FIG. 6 above, the read thresholds in question are MSB thresholds i1 . . . i4.

The memory controller assigns a respective different binary code to each read threshold to be separated, at a code assignment step 144. In the example of FIG. 6, the binary code comprises code words 132A and 132B.

Memory controller 40 then defines one or more separator pages based on the assigned binary code, at a separator definition step 148. In the example of FIG. 6, the separator pages comprise pages 136A and 136B (S1 and S2), which are derived respectively from code words 132A and 132B.

Memory controller 40 reads the group of memory cells using the separator pages, at a separator readout step 152.

The memory controller then constructs partial syndromes, at a partial syndrome computation step 156, and finds the optimal read thresholds using the partial syndromes, at a threshold optimization step 160.

As noted above, the method of FIG. 7 can be implemented using any desired combination of explicit read thresholds in intervals 128. Hybrid threshold sets can then be evaluated from these explicit readout results using any suitable method, e.g., by computing artificial readout results or by computing partial syndromes.

In the embodiments of FIGS. 6 and 7 above, a clear distinction existed between separator pages (used for separation) and data pages (used for data readout). In other words, a clear distinction existed between auxiliary thresholds (used for separation) and explicit read thresholds (used for data readout).

In alternative embodiments, memory controller 40 defines multiple sets of read thresholds, and uses them for both separation and readout. These sets of read thresholds are referred to herein as self-separating thresholds. Such sets of read thresholds typically do not have any elements in common, as opposed to sets 136A and 136B in the example of FIG. 6, which share i1_MAX and i3_MIN.

This self-separation technique eliminates the need for dedicated readout using auxiliary thresholds that are not used for data readout, and therefore reduces the number of read operations. Additionally, since the read threshold sets are disjoint, this technique obtains an equal number of different values for each read threshold. On the other hand, this technique is only applicable when the number of explicit sets of read thresholds is equal to or larger than the number of read thresholds. Moreover, in order to alter any single value of one of the read thresholds while still maintaining the property of self-separation, all sets should be updated and explicit readout results re-read.

Figure 8:
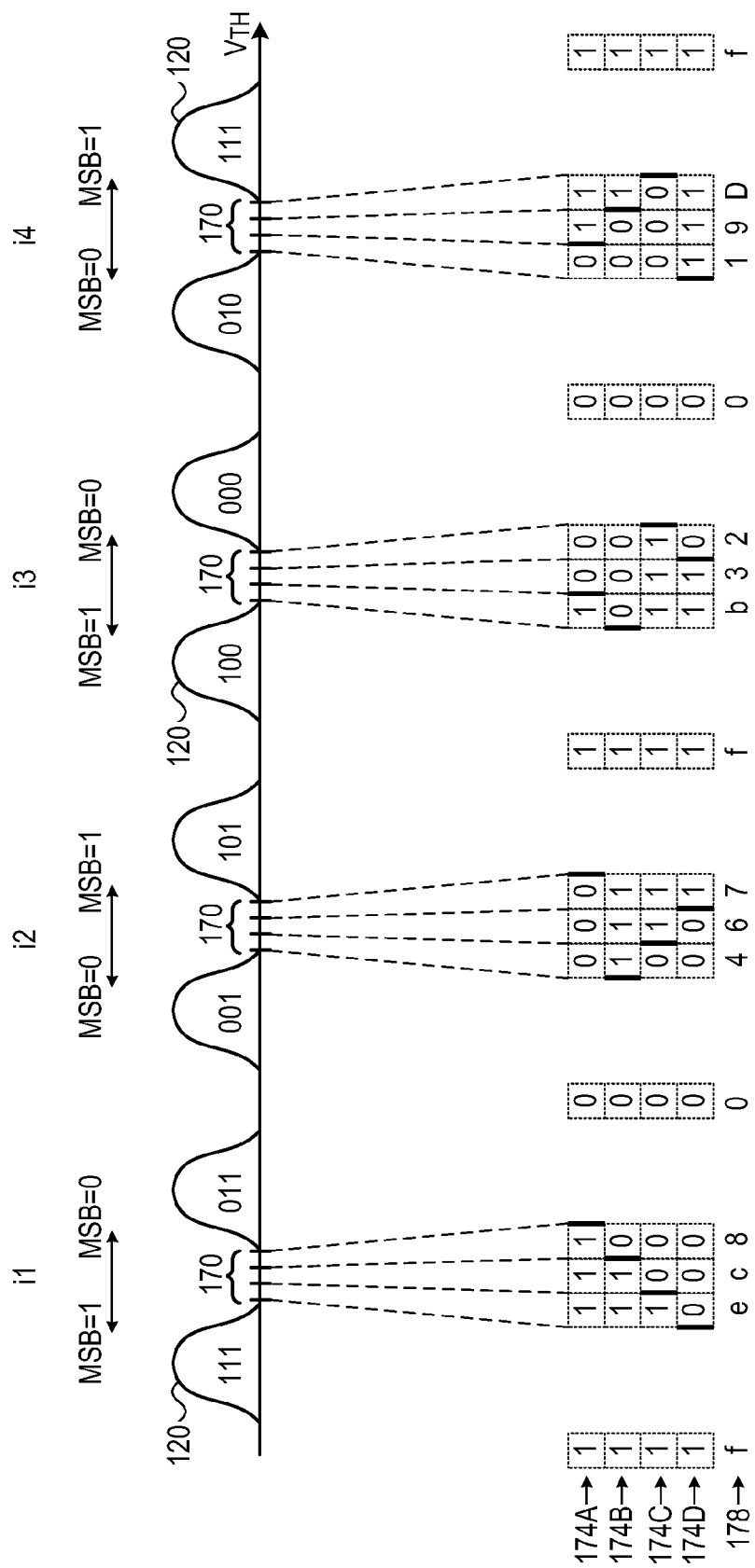
FIG. 8 is a diagram that schematically illustrates a scheme for readout using self-separating thresholds, in accordance with an alternative embodiment of the present invention.

FIG. 8 is a diagram that schematically illustrates a scheme for readout using self-separating thresholds, in accordance with an alternative embodiment of the present invention. In the present example, four explicit thresholds 170 are positioned in each of intervals i1 . . . i4. The memory controller performs a total of four explicit readout operations using predefined combinations of explicit thresholds 170.

Four explicit readout results 174A . . . 174D, produced respectively by the four explicit readout operations, are shown at the bottom of the figure. In each set of explicit readout results, four bold lines indicate the four explicit thresholds used for readout.

The bit-wise combination of readout results 174A . . . 174D is shown as a vector 178 of hexadecimal values. As can be seen in the figure, the hexadecimal values are unique, with the exception of "f" and "0" values that appear more than once but are far away from the regions of interest. Therefore, this configuration of explicit readout operations gives a fine and unambiguous resolution as to the threshold voltage intervals in which the cell threshold voltages fall.

Readout results 174A . . . 174D can be used for evaluating hybrid threshold sets using any of the techniques described above, e.g., using generation of artificial readout results or using computation of partial syndromes. In addition, as can be seen in the figure, each of readout results 174A . . . 174D uses one explicit threshold in each respective different interval 128. Therefore, each of readout results 174A . . . 174D can be used for decoding the MSB data, without a need for additional readout operations.

In some embodiments, in order to reduce memory requirements, the memory controller may derive the readout results of separator pages S1 and S2, defined above, from readout results 174A . . . 174D. The raw readout results 174A . . . 174D can then be discarded. Moreover, it can be shown that one or more of the partial syndromes produced from readout results 174A . . . 174D are zero, and can therefore be nulled.

Although the embodiments described herein mainly address data storage applications and memory devices, the methods and systems described herein can also be used in other applications, such as in receivers of digital communication systems.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
reading a group of analog memory cells using first explicit read thresholds, to produce first readout results;
re-reading the group using second explicit read thresholds, to produce second readout results;
reading the group using one or more sets of auxiliary thresholds so as to produce auxiliary readout results, such that the number of the auxiliary thresholds in each set is the same as the number of the first explicit read thresholds and the same as the number of the second explicit read thresholds; and
evaluating a readout performance of third read thresholds, which comprise at least one of the first explicit read thresholds and at least one of the second explicit read thresholds, using the first, second and auxiliary readout results.

2. The method according to claim 1, wherein the auxiliary thresholds in each set lie in respective intervals of analog values stored in the memory cells, and comprising setting the auxiliary thresholds in each set to a respective different combination of lower and upper edges of the respective intervals.

3. The method according to claim 2, wherein setting the auxiliary thresholds comprises assigning a respective different binary code to each of the intervals, and choosing between the lower and upper edges of the intervals depending on the binary code.

4. The method according to claim 2, wherein evaluating the readout performance comprises identifying, using the auxiliary readout results, subsets of the memory cells whose analog values fall in the respective intervals, and assessing the readout performance using the identified subsets.

5. The method according to claim 4, wherein assessing the readout performance comprises deriving from the identified subsets third readout results that would be produced by reading the group using the third read thresholds, and assessing the readout performance based on the third readout results.

6. The method according to claim 4, wherein the group stores data that is encoded with an Error Correction Code (ECC) that is representable by multiple check equations, and wherein assessing the readout performance comprises assessing a count of the check equations that are satisfied by the third readout results.

7. The method according to claim 4, wherein the group stores data that is encoded with an Error Correction Code (ECC) that is representable by multiple check equations, and wherein assessing the readout performance comprises deriving from the identified subsets respective partial syndromes of the ECC and assessing the readout performance using the partial syndromes.

8. The method according to claim 1, and comprising selecting optimal read thresholds based on the evaluated readout performance.

9. The method according to claim 8, wherein selecting the optimal read thresholds comprises choosing the optimal read thresholds from among the first explicit read thresholds, the second explicit read thresholds and the third read thresholds.

10. The method according to claim 8, wherein selecting the optimal read thresholds comprises choosing the optimal read thresholds from among the first explicit read thresholds, the second explicit read thresholds, the third read thresholds, and the sets of the auxiliary thresholds.

11. Apparatus, comprising:
an interface, which is configured to communicate with a memory comprising multiple analog memory cells; and
storage circuitry, which is configured to read a group of the analog memory cells using first explicit read thresholds so as to produce first readout results, to re-read the group using second explicit read thresholds so as to produce second readout results, to read the group using one or more sets of auxiliary thresholds so as to produce auxiliary readout results, such that the number of the auxiliary thresholds in each set is the same as the number of the first explicit read thresholds and the same as the number of the second explicit read thresholds, and to evaluate a readout performance of third read thresholds, which comprise at least one of the first explicit read thresholds and at least one of the second explicit read thresholds, using the first, second and auxiliary readout results.

12. The apparatus according to claim 11, wherein the auxiliary thresholds in each set lie in respective intervals of analog values stored in the memory cells, and wherein the storage circuitry is configured to set the auxiliary thresholds in each set to a respective different combination of lower and upper edges of the respective intervals.

13. The apparatus according to claim 12, wherein the storage circuitry is configured to assign a respective different binary code to each of the intervals, and to choose between the lower and upper edges of the intervals depending on the binary code.

14. The apparatus according to claim 12, wherein the storage circuitry is configured to identify, using the auxiliary readout results, subsets of the memory cells whose analog values fall in the respective intervals, and to assess the readout performance using the identified subsets.

15. The apparatus according to claim 14, wherein the storage circuitry is configured to derive from the identified subsets third readout results that would be produced by reading the group using the third read thresholds, and to assess the readout performance based on the third readout results.

16. The apparatus according to claim 14, wherein the group stores data that is encoded with an Error Correction Code (ECC) that is representable by multiple check equations, and wherein the storage circuitry is configured to assess the readout performance by assessing a count of the check equations that are satisfied by the third readout results.

17. The apparatus according to claim 14, wherein the group stores data that is encoded with an Error Correction Code (ECC) that is representable by multiple check equations, and wherein the storage circuitry is configured to derive from the identified subsets respective partial syndromes of the ECC and to assess the readout performance using the partial syndromes.

18. The apparatus according to claim 11, wherein the storage circuitry is configured to select optimal read thresholds based on the evaluated readout performance.

19. The apparatus according to claim 18, wherein the storage circuitry is configured to choose the optimal read thresholds from among the first explicit read thresholds, the second explicit read thresholds and the third read thresholds.

20. The apparatus according to claim 18, wherein the storage circuitry is configured to choose the optimal read thresholds from among the first explicit read thresholds, the second explicit read thresholds, the third read thresholds, and the sets of the auxiliary thresholds.

* * * * *